US011215657B2

(12) United States Patent
Yao et al.

(10) Patent No.: US 11,215,657 B2
(45) Date of Patent: Jan. 4, 2022

(54) REAL-TIME ONLINE PREDICTION METHOD FOR DYNAMIC JUNCTION TEMPERATURE OF SEMICONDUCTOR POWER DEVICE

(71) Applicant: NANJING ESTUN AUTOMATION CO., LTD, Nanjing (CN)

(72) Inventors: Tian Yao, Nanjing (CN); Guojun Yu, Nanjing (CN); Maoyu Miao, Nanjing (CN); Xiaojun Xu, Nanjing (CN); Wei Qian, Nanjing (CN)

(73) Assignee: NANJING ESTUN AUTOMATION CO., LTD, Nanjing (CN)

( * ) Notice: Subject to any disclaimer, the term of this patent is extended or adjusted under 35 U.S.C. 154(b) by 314 days.

(21) Appl. No.: 16/387,310

(22) PCT Filed: Sep. 30, 2018

(86) PCT No.: PCT/CN2018/108960
§ 371 (c)(1),
(2) Date: Apr. 17, 2019

(87) PCT Pub. No.: WO2019/063000
PCT Pub. Date: Apr. 4, 2019

(65) Prior Publication Data
US 2019/0377023 A1 Dec. 12, 2019

(30) Foreign Application Priority Data
Dec. 6, 2017 (CN) .......................... 201711273620.2

(51) Int. Cl.
*G01R 31/26* (2020.01)
*G01K 7/42* (2006.01)

(52) U.S. Cl.
CPC ......... *G01R 31/2601* (2013.01); *G01K 7/427* (2013.01)

(58) Field of Classification Search
CPC ............................ G01K 7/427; G01R 31/2601
See application file for complete search history.

(56) References Cited

U.S. PATENT DOCUMENTS 10,337,930 B2 * 7/2019 Hasan ..................... G01K 7/01
2004/0066837 A1 4/2004 Armour
(Continued)

FOREIGN PATENT DOCUMENTS

| CN | 103954900 | 7/2014 |
| CN | 103956887 | 7/2014 |

(Continued)

*Primary Examiner* — Bryan Bui
(74) *Attorney, Agent, or Firm* — Treasure IP Group, LLC

(57) ABSTRACT

The present invention discloses a real-time online prediction method for a dynamic junction temperature of a semiconductor power device. The present invention has advantages as follows: the sampling value of electrical parameters required for system closed-loop control is multiplexed as inputs, and no additional system hardware circuits and costs are needed; the processor resources can be saved to the utmost extent by using the idea of discrete iterative calculation, online calculation can be realized, and real-time performance of dynamic junction temperature calculation can be ensured; an optimal fitting dynamic thermal resistance discretization model is creatively proposed, and is used to perform iterative calculation, so that while real-time performance of dynamic junction temperature calculation of the power device is ensured, calculation accuracy is also ensured, meeting the requirements of protection, life prediction, and reliability design of the power device, and this method is very suitable for actual engineering application.

3 Claims, 1 Drawing Sheet

(56) References Cited

U.S. PATENT DOCUMENTS

2016/0328512 A1    11/2016   Chen  
2016/0334280 A1*   11/2016   Hasan ..................... G01K 7/01

FOREIGN PATENT DOCUMENTS

| CN | 105574285 A | * | 5/2016 |
| CN | 106199367 | | 12/2016 |
| CN | 106610445 | | 5/2017 |
| CN | 108072821 | | 5/2018 |

* cited by examiner

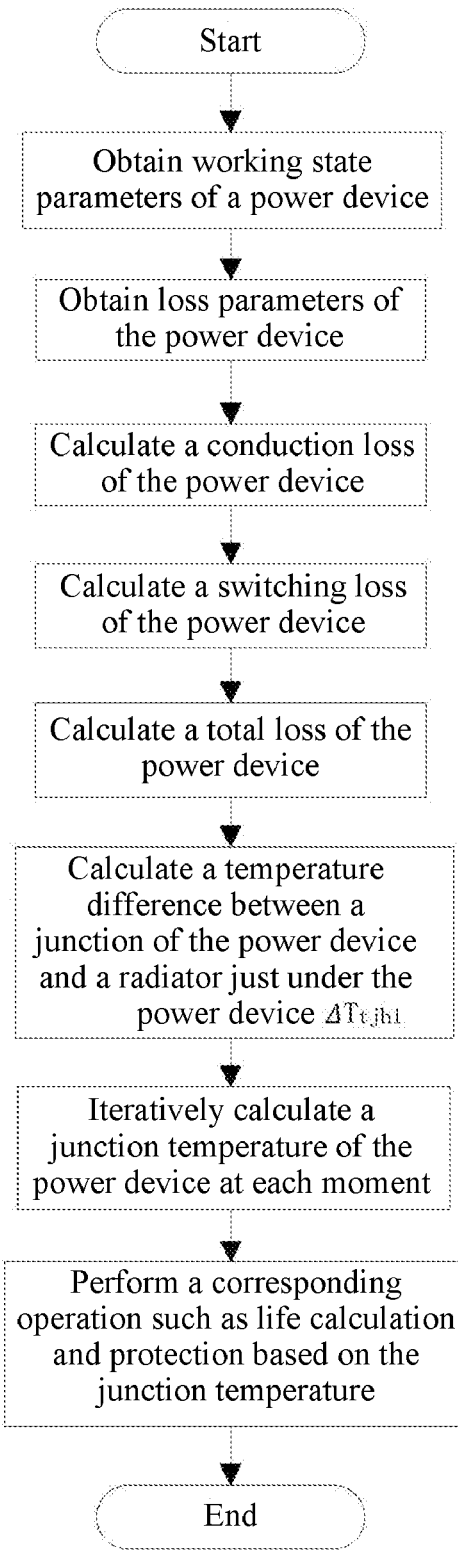

REAL-TIME ONLINE PREDICTION METHOD FOR DYNAMIC JUNCTION TEMPERATURE OF SEMICONDUCTOR POWER DEVICE

CROSS REFERENCE TO RELATED APPLICATION

This application claims priority to a PCT application PCT/CN2018/108960, filed on Sep. 30, 2018, which in turn takes priority of Chinese Application No. 201711273620.2, filed on Dec. 6, 2017. Both the PCT application and Chinese Application are incorporated herein by reference in their entireties.

BACKGROUND

Technical Field

The present invention relates to a prediction detection method for a junction temperature of a semiconductor power device, and specifically, to a real-time online prediction method for a dynamic junction temperature of a semiconductor power device.

Related Art

In recent years, as a core component in fields such as industrial automation, traffic and transportation, smart power grids, and new energy, a semiconductor power device's reliability-related research has become a hotspot in researches of institutions of higher learning, scientific research institutions, and large and medium-sized high-tech enterprises at home and aboard. A junction temperature of a semiconductor power device is a most crucial parameter for determining its service life, and researches indicate that 60% of failures of the semiconductor power device are caused by an excessively high internal junction temperature, and almost all mechanical failures of the power device stem from a power cycle and a thermal cycle triggered by a junction temperature fluctuation.

At present, there are mainly three methods for obtaining a junction temperature of a semiconductor power device:

(1) A direct measurement method: a junction temperature of an internal chip in the power device is directly measured by using a device such as a temperature sensor and a thermal imager. As described in Patent CN103954900A "METHOD FOR MEASURING STABLE THERMAL RESISTANCE VALUE OF IGBT", an IGBT device is decaped in a front side to completely expose a chip surface of the IGBT device, the IGBT device is fixed on a radiating fin having a tiny hole, and a thermocouple is inserted into the tiny hole, so that one end of the thermocouple is in contact with a shell on a back side of the IGBT device, and the other end of the thermocouple is connected to a testing device. Based on a voltage value of an applied voltage, a tube-shell temperature, a surface temperature, and an environment temperature, a crusting thermal resistance value of the IGBT device and a thermal resistance value of a junction environment are obtained separately through calculation. In the method, the thermocouple is used to directly measure the junction temperature of the power device, and this method has the following defects: 1. The power device has relatively high integration, a relatively high process requirement is needed for installing a temperature sensor near the chip, and a rejection rate is high, influencing the voltage withstand level and insulation level between internal chips, and greatly reducing reliability of the power device. A power device of an embedded temperature sensor generally only can be applied to measurement study, and cannot be used as a mass product. 2. A conventional temperature sensor has a relatively large thermal time constant, cannot be used to obtain a dynamic junction temperature of the power device, and can be only used to obtain a stable junction temperature. A temperature sensor manufactured to obtain a dynamic junction temperature has a quite small diameter, is easily damaged, can be only used for measurement study, and is difficult to be integrated into mass product. 3. The power device needs to be broken and the chip surface needs to be blackened, to measure the junction temperature by using a thermal imager, and compared with the temperature sensor, in this method, desirable response and precision can be obtained, but irreversible damages are brought to package and insulation of the power device. Therefore, the method also cannot be used for mass product.

(2) An indirect measurement method: a junction temperature is obtained through indirect conversion by measuring a thermal sensitive electrical parameter of a power device. For example, as described in Patent CN106199367A "MEASUREMENT APPARATUS FOR JUNCTION TEMPERATURE OF IGBT", a junction temperature of a chip inside a power device is determined by detecting a turn-off delay of a power switch device in combination with a conduction current. In addition, there are many actual cases of indirectly obtaining the junction temperature by using the thermal sensitive electrical parameter of the power device, for example, by using a turn-on voltage of gate, a miller platform voltage of gate, miller platform duration, and a conduction voltage drop, but this method also has defects: 1. The thermal sensitive electrical parameter of the power device is generally different from an electrical parameter required by system closed-loop control, and a detection circuit needs to be additionally added on a system hardware architecture, which definitely increases hardware costs. 2. The thermal sensitive electrical parameter of the power device needs to be measured in real time and precisely, which has a high requirement on performance and design of a measurement circuit and a sampling circuit, and is difficult for actual engineering application. 3. A linear relationship between the thermal sensitive electrical parameter and the junction temperature of the power device is generally available only in a relatively small range, and it is difficult to obtain junction temperature in a full range.

(3). A direct power consumption calculation method: a junction temperature of a device is calculated in a mathematical method by establishing a mathematical model of power consumption and thermal resistance of the power device. For example, as described in patent CN103956887A "ONLINE TESTING METHOD FOR JUNCTION TEMPERATURE OF IGBT MODULE OF WIND POWER CONVERTER", a loss of the power device is calculated by using a mathematical model, and a stable junction temperature of the power device is calculated with a stable thermal resistance. In the foregoing patent, the stable thermal resistance (constant) is used, and the stable junction temperature is calculated. When a dynamic junction temperature is calculated, a dynamic thermal resistance model (usually fourth-order Foster model) is needed. Calculation by directly using the foregoing method costs many CPU resources, and it is also difficult to ensure real-time calculation. Therefore, there is rarely a case of performing real-time online calculation on the dynamic junction temperature by using this method in actual engineering application.

SUMMARY OF THE INVENTION

A problem to be resolved by the present invention is to provide a real-time online prediction method for a dynamic junction temperature of a semiconductor power device, to overcome the defects in the prior art, so that in an original control platform of a system, the sampling value of electrical parameters required for system closed-loop control is multiplexed, a loss of an internal chip in the power device is discretely calculated, and a real-time junction temperature of the internal chip in the power device is obtained through online iterative calculation with an optimal fitting dynamic thermal resistance discretization model.

A technical solution provided by the present invention for achieving the inventive objective is a real-time online prediction method for a dynamic junction temperature of a semiconductor power device, including the following steps:

Step 1: Obtain working state parameters of the semiconductor power device, including an output current of the power device, a bus voltage of the power device, and a temperature of a radiator just under the power device.

Step 2: Obtain loss parameters of the semiconductor power device, including a conduction voltage drop $U_{CE}$, a turn-on energy $E_{on}$, and a turn-off energy $E_{off}$ corresponding to a current $I_T$ flowing through the semiconductor power device at a given temperature.

Step 3: Calculate a conduction loss of the semiconductor power device: calculating a conduction loss $P_{DC}$ of the semiconductor power device in a calculation period $T_S$ according to the obtained conduction voltage drop $U_{CE}$ corresponding to the current $I_T$ flowing through the semiconductor power device:

$$P_{DC}=U_{CE}*I_T*D$$

where D is a conduction duty cycle of the semiconductor power device in the calculation period $T_S$.

Step 4: Calculate a switching loss of the semiconductor power device: calculating the switching loss $P_{sw}$ of the semiconductor power device according to the obtained turn-on energy $E_{on}$ and turn-off energy $E_{off}$ corresponding to the current $I_T$ flowing through the semiconductor power device:

$$P_{sw}=(E_{on}+E_{off})*f$$

where f is a switching frequency of the semiconductor power device.

Step 5: Calculate a total loss of the semiconductor power device: acquiring the total loss P of the power device according to the conduction loss and the switching loss acquired in the step 3 and the step 4:

$$P=P_{DC}+P_{sw}$$

Step 6: Calculate a temperature difference $\Delta T_{tjh1}$ between the junction of the semiconductor power device and the radiator surface just under the power device. According to the obtained total loss P of the semiconductor power device in the calculation period $T_S$, a temperature difference $\Delta T_{tjh1}$ as mentioned above after a calculation period $T_S$ can be accurately calculated by using a formula as below, using an optimal fitting dynamic thermal resistance discretization model.

$$\Delta T_{tjh1}=\Delta T_{tjh0}+P*R_{thjc[@T_S]}-\Delta T_{tjh0}*\lambda$$

where $\Delta T_{tjh0}$ is the temperature difference between the junction of the power device and the radiator surface just under the power device at the end of the previous calculation period, $\lambda$ is a discrete coefficient that is obtained after optimal fitting is performed on a dynamic thermal resistance curve of the power device and that is related to the calculation period $T_S$ and the dynamic thermal resistance curve, and $R_{thjc[@T_S]}$ is a transient thermal resistance of the power device corresponding to the time $T_S$.

Step 7: Iteratively calculate the junction temperature of the power device at each moment: repeating the step 1 to the step 6, then adding the real time temperature of the radiator surface just under the power device to the calculation result $\Delta T_{tjh1}$ of the step 6, and performing real-time online prediction to obtain the junction temperature of each semiconductor power device.

A specific application of the real-time junction temperature $T_{tjh}$ of the semiconductor power device is as follows. The following uses two applications as examples to illustrate the application of the junction temperature $T_{tjh}$ of the semiconductor power device (the present invention is effective to all applications of the real-time junction temperature $T_{tjh}$ of the power device, and is not limited to the following two):

1. According to the real-time junction temperature $T_{tjh}$ of the power device, the working state of the power device can be determined in real time, and life of the power device can be estimated, and the custom can be prompted to exchange. 2. According to the real-time junction temperature $T_{tjh}$ of the power device, a junction temperature protection threshold of the power device is set, and a junction temperature can be protected in time when exceeding the threshold, so that the power device is more reliable when working.

The technical effects of the present invention are as follows:

Compared with an existing method for obtaining a junction temperature of a power device, the present invention has advantages as follows: (1) The sampling value of electrical parameters required for system closed-loop control is multiplexed as inputs, so that it is realized by only adding a software algorithm to the system original control platform, and no additional system hardware circuits and costs are increased. (2) In this method, processor resources can be saved to the utmost extent by using the idea of discrete iterative calculation, online calculation can be realized, and real-time performance of dynamic junction temperature calculation can be ensured. (3) In this method, an optimal fitting dynamic thermal resistance discretization model is creatively proposed, and is used to perform iterative calculation, so that while real-time performance of dynamic junction temperature calculation of the power device is ensured, calculation accuracy is also ensured, meeting the requirements of protection, life prediction, and reliability design of the power device. (4) In conclusion, this method is very suitable for actual engineering application.

1. In the present invention, the sampling value of electrical parameters required for system closed-loop control is multiplexed as inputs, and it is realized by only adding a software algorithm to the system original control platform. On the one hand, the electrical parameter sampling circuits are multiplexed, and no additional hardware costs are needed; on the other hand, calculation parameters of software algorithms can be adjusted according to different measurement objects, so that junction temperature calculation for different series and different model numbers of power devices can be realized without cost addition.

2. In this method, processor resources can be saved to the utmost extent by using the idea of discrete iterative calculation, online calculation can be realized, and real-time performance of dynamic junction temperature calculation can be ensured.

3. In this method, an optimal fitting dynamic thermal resistance discretization model is creatively proposed, and is used to perform iterative calculation, so that while real-time performance of dynamic junction temperature calculation of the power device is ensured, calculation accuracy is also ensured, meeting the requirements of protection, life prediction, and reliability design of the power device.

4. In the present invention, a direct calculation method of the junction temperature is used, no special processing needs to be performed on a power device, and the performance of power device is not affected at all, so that this method is very suitable for actual engineering application.

BRIEF DESCRIPTION OF THE DRAWING

FIG. 1 is a program block diagram of a real-time online prediction method for a dynamic junction temperature of a semiconductor power device according to the present invention.

DETAILED DESCRIPTION

The following further describes the method of the present invention in detail with reference to embodiments.

Embodiment: An IGBT module (FF600R12ME4) of a power device is used as an example to describe specific implementations of the method of the present invention (the present invention is effective to all power devices, and is not limited to the IGBT module). As shown in FIG. 1, a specific implementation of the method of the present invention mainly includes the following steps:

Step 1: Obtain working state parameters of the IGBT module (FF600R12ME4): an output current of the power device, a bus voltage of the power device, and a temperature of a radiator just under the power device.

For example, an average current of the IGBT module (FF600R12ME4) in a time period $T_S=10$ ms is $I_T=300A$, the bus voltage of the power device is 600V, and the temperature of the radiator is 100° C.

Step 2: Obtain loss parameters of the IGBT module (FF600R12ME4) of the semiconductor power device, including a conduction voltage drop $U_{CE}$, a turn-on energy $E_{on(IGBT)}$, and a turn-off energy $E_{off(IGBT)}$ corresponding to a current $I_T$ flowing through the IGBT of the power device at a given temperature.

For example: at a given temperature, corresponding to the current $I_T=300A$ flowing through the IGBT module (FF600R12ME4), an IGBT conduction voltage drop $U_{CE(FF600R12ME4)}=1.4V$, a turn-on energy $E_{on(FF600R12ME4)}=0.033J$, and a turn-off energy $E_{off(FF600R12ME4)}=0.034J$.

Step 3: Calculate a conduction loss of the IGBT module (FF600R12ME4) of the semiconductor power device: calculating an IGBT conduction loss $P_{DC(IGBT)}$ corresponding to a calculation period $T_S$ according to the obtained conduction voltage drop $U_{CE(IGBT)}$ corresponding to the current $I_{T(IGBT)}$ flowing through the IGBT of the semiconductor power device:

$$P_{DC(IGBT)}=U_{CE(IGBT)}*I_T*D$$

where D is a conduction duty cycle of the semiconductor power device in the calculation period $T_S$;

For example, the conduction loss of the IGBT module (FF600R12ME4) is calculated as follows:

$$P_{DC(FF600R12ME4)}=U_{CE(FF600R12ME4)}*I_T*D=1.4*300*0.5=210W$$

The conduction duty cycle of the IGBT module (FF600R12ME4) in the calculation period $T_S=10$ ms is 0.5.

Step 4: Calculate a switching loss of the semiconductor power device: calculating a switching loss $P_{sw(IGBT)}$ of the IGBT of the semiconductor power device according to the obtained turn-on energy $E_{on(IGBT)}$ and turn-off energy $E_{off(IGBT)}$ corresponding to the current $I_T$ flowing through the IGBT of the semiconductor power device:

$$P_{sw(IGBT)}=[E_{on(IGBT)}E_{off(IGBT)}]*f$$

where f is a switching frequency of the semiconductor power device.

For example, the switching loss of the IGBT module (FF600R12ME4) of the semiconductor power device is calculated as follows:

$$P_{sw(FF600R12ME4)}=[E_{on(FF600R12ME4)}d+E_{off(FF600R12ME4)}]*f=(0.034+0.033)*5000=335W$$

A working switching frequency of the IGBT module (FF600R12ME4) is 5000 Hz.

Step 5: Calculate a total loss of the semiconductor power device. A total loss $P_{(IGBT)}$ of the semiconductor power device may be acquired according to the conduction loss and the switching loss acquired in the step 3 and the step 4:

$$P_{(IGBT)}=P_{DC(IGBT)}+P_{sw(IGBT)}$$

For example, the total loss of the IGBT module (FF600R12ME4) of the semiconductor power device is calculated as follows:

$$P_{(FF600R12ME4)}=P_{DC(FF600R12ME4)}+P_{sw(FF600R12ME4)}=210+335=545W$$

Step 6: Calculate a temperature difference $\Delta T_{tjh1}$ between the junction of the semiconductor power device and the radiator surface just under the power device. According to the obtained total loss $P_{(IGBT)}$ of the IGBT corresponding to the calculation period $T_S$, a temperature difference $\Delta T_{tjh1(IGBT)}$ as mentioned above after a calculation period $T_S$ can be accurately calculated by using a formula as below, using an optimal fitting dynamic thermal resistance discretization model:

$$\Delta T_{tjh1(IGBT)}=\Delta T_{tjh0(IGBT)}+P_{(IGBT)}*R_{thjc[@T_S]}-\Delta T_{tjh0(IGBT)}*\lambda$$

where $\Delta T_{tjh0(IGBT)}$ is the temperature difference between the junction of the power device and the radiator surface just under the power device at the end of the previous calculation period, $\lambda$ is a discrete coefficient that is obtained after optimal fitting is performed on a dynamic thermal resistance curve of the power device and that is related to the calculation period $T_S$ and the dynamic thermal resistance curve, and $R_{thjc[@T_S]}$ is a transient thermal resistance of the power device corresponding to the time $T_S$.

For example, the temperature difference $\Delta T_{tjh1}$ between the junction of the IGBT module (FF600R12ME4) and the radiator surface just under the power device at the end of the calculation period $T_S=10$ ms is calculated:

$$\Delta T_{tjh1(FF600R12ME4)}=\Delta T_{tjh0(FF600R12ME4)}+P_{(FF600R12ME4)}*R_{thjc[@10\ ms]}-\Delta T_{tjh0(FF600R12ME4)}*\lambda$$

$$=25+545*0.015-25*0.366=24.025$$

where $\Delta T_{tjh1(FF600R12ME4)}$ is the temperature difference 25° C. between the junction of the IGBT module (FF600R12ME4) and the radiator surface just under the power device at the end of the previous calculation period, is a discrete coefficient that is obtained after optimal fitting is performed on a dynamic thermal resistance curve of the power device and that is related to the calculation period $T_S$ and a dynamic thermal resistance curve of the IGBT module FF600R12ME4, where 0.366 is selected herein, and $R_{thjc}$ [@10 ms] is a transient thermal resistance 0.015 of the IGBT module (FF600R12ME4) corresponding to the time 10 ms.

Step 7: Iteratively calculate the junction temperature of the power device at each moment. Step 1 to step 6 are repeated, then the real-time temperature of the radiator surface just under the power device is added to the calculation result $\Delta T_{tjh1}$ of the step 6, and real-time online prediction may be performed to obtain the junction temperature of each power device.

For example, the junction temperature of the IGBT module (FF600R12ME4) after the calculation period 10 ms is calculated as follows:

$$T_{tjh1(FF600R12ME4)} = 24.025 + 100° C. = 124.025° C.$$

Based on this method, the junction temperature of the IGBT module (FF600R12ME4) at any moment can be calculated.

In the present invention, the sampling value of electrical parameters required for system closed-loop control is multiplexed as inputs, and it is realized by only adding a software algorithm to the system original control platform. On the one hand, the electrical parameter sampling circuits are multiplexed, and no additional hardware costs are needed; on the other hand, calculation parameters of software algorithms can be adjusted according to different measurement objects, so that junction temperature calculation for different series and different model numbers of power devices can be realized without cost addition.

In this method, processor resources can be saved to the utmost extent by using the idea of discrete iterative calculation, online calculation can be realized, and real-time performance of dynamic junction temperature calculation can be ensured.

In this method, an optimal fitting dynamic thermal resistance discretization model is creatively proposed, and is used to perform iterative calculation, so that while real-time performance of dynamic junction temperature calculation of the power device is ensured, calculation accuracy is also ensured, meeting the requirements of protection, life prediction, and reliability design of the power device.

In the present invention, a direct calculation method of the junction temperature is used, no special processing needs to be performed on a power device, and the performance of power device is not affected at all, so that this method is very suitable for actual engineering application.

The most important advantage of our junction temperature prediction method is that it is a real-time online junction temperature achieved by an optimal fitting dynamic thermal resistance discretization model with minimum CPU resources (storage space, computational complexity). In our motor drive system, 2 us is used for DSP 28377S. Completion of junction temperature calculation). In the method disclosed herein, it reuses the control CPU in the system, and sampling value of electrical parameters required for system closed-loop control is multiplexed as inputs from original sampling circuits without adding any hardware cost.

The algorithm in the present invention is practical and has been used in motor drive systems. It can provide reliable real-time protection and life prediction for power semiconductor devices in motor drive systems.

The present invention is not limited to the practical application background of the motor drive system, because in any device with power semiconductor devices, such algorithms and its possible improvement, can be integrated. For example, not being limited to, wind power drive, photovoltaic inverter, electric car and electrical drive and so on.

One example of the power semiconductor device of the present invention is the power semiconductor device in a motor drive system. The algorithm disclosed herein is not an offline/online tool that performs operations on an external computer, but an algorithm that is integrated in the power electronic device, multiplexes the CPU of the power electronic device, and its hardware sampling circuit, and calculates the data in real time with minimal resources, a tool is disclosed herein, comprising an algorithm is integrated in the electronically controlled CPU of the semiconductor power device system.

In one embodiment of the present invention, a semiconductor power device system is described. Power electronics systems includes semiconductor power devices. The semiconductor power device system comprises a semiconductor power device having a dynamic junction temperature; a computer readable storage medium, having stored thereon a computer program and included in the semiconductor power device system, said program arranged to: operate a processor of the semiconductor power device to perform a method of predicting a real-time dynamic junction temperature of the semiconductor power device, comprising the steps 1-7 of the detail description section.

In another embodiment of the present invention, an on-line real time dynamic junction temperature prediction tool integrated on power electronics systems which including semiconductor power devices for use to predict a semiconductor power device junction temperature is described. The tool comprises a computer readable storage medium of the semiconductor power device system, having stored thereon a computer program, said program arranged to operate a processor to perform a method of predicting a real-time dynamic junction temperature of the semiconductor power device, comprising the following steps comprising the steps 1-7 of the detail description section.

In the above aforementioned embodiments, the power electronics systems are considered as semiconductor power device systems, which including semiconductor power devices and the on-line real time dynamic junction temperature prediction tool is integrated on power electronics systems.

What is claimed is:
1. A method of making a semiconductor power device having an improved lifetime, comprising
  implementing a real-time online prediction method for a dynamic junction temperature of a semiconductor power device, comprising the following steps:
  step 1: sensing working state parameters of the semiconductor power device: an output current of the power device, a bus voltage of the power device, and a temperature of a radiator just under the power device;
  step 2: calculating loss parameters of the semiconductor power device by fitting curve method: a conduction voltage drop $U_{CE}$, a turn-on energy $E_{on}$, and a turn-off energy $E_{off}$ corresponding to a current $I_T$ flowing through the semiconductor power device at a given temperature;
  step 3: calculating a conduction loss $P_{DC}$ of the semiconductor power device in a calculation period $T_S$ according to the obtained conduction voltage drop $U_{CE}$ corresponding to the current $I_T$ flowing through the semiconductor power device:

$$P_{DC}=U_{CE}*I_T*D$$

wherein D is a conduction duty cycle of the semiconductor power device in the calculation period $T_S$ a time interval from step 1 sensing working state parameters to step 7 performing real-time online prediction to obtain the junction temperature of each semiconductor power device;

step 4: calculating a switching loss $P_{sw}$ of the semiconductor power device according to the obtained turn-on energy $E_{on}$ and turn-off energy $E_{off}$ corresponding to the current $I_T$ flowing through the semiconductor power device:

$$P_{sw}=(E_{on}+E_{off})*f$$

wherein f is a switching frequency of the semiconductor power device;

step 5: acquiring a total loss P of the semiconductor power device according to the conduction loss and the switching loss acquired in the step 3 and the step 4:

$$P=P_{DC}+P_{sw}$$

step 6: calculating a temperature difference $\Delta T_{tjh1}$ between the junction of the semiconductor power device and the radiator surface just under the power device:

$$\Delta T_{tjh1}=\Delta T_{tjh0}+P*R_{thjc[@T_S]}-\Delta T_{tjh0}*\lambda$$

wherein $\Delta T_{tjh0}$ is the temperature difference between the junction of the power device and the radiator surface just under the power device at the end of the previous calculation period, $\lambda$ is a discrete coefficient that is obtained after optimal fitting is performed on a dynamic thermal resistance curve of the power device and that is related to the calculation period $T_S$ and the dynamic thermal resistance curve, and $R_{thjc[@T_S]}$ is a transient thermal resistance of the power device corresponding to the calculation period $T_S$;

step 7: iteratively calculating the junction temperature of the power device at each moment:

repeating the step 1 to the step 6, then adding the real time temperature of the radiator surface just under the power device to the calculation result $\Delta T_{tjh1}$ of the step 6, and performing real-time online prediction to obtain the junction temperature of each semiconductor power device.

2. A semiconductor power device system, comprising
a semiconductor power device integrated thereon, having a dynamic junction temperature;
a computer readable storage medium, having stored thereon a computer program and integrated in the semiconductor power device system, said program arranged to:
operate a processor of the semiconductor power device to perform a method of predicting a real-time dynamic junction temperature of the semiconductor power device, comprising the following steps:

step 1: sensing working state parameters of the semiconductor power device by original sampling circuits of the semiconductor power device working state parameters of the semiconductor power device: an output current of the power device, a bus voltage of the power device, and a temperature of a radiator just under the power device;

step 2: sensing working state parameters of the semiconductor power device by original sampling circuits of the semiconductor power device loss parameters of the semiconductor power device: a conduction voltage drop $U_{CE}$, a turn-on energy $E_{on}$, and a turn-off energy $E_{off}$ corresponding to a current $I_T$ flowing through the semiconductor power device at a given temperature;

step 3: calculating a conduction loss $P_{DC}$ of the semiconductor power device in a calculation period $T_S$ according to the obtained conduction voltage drop $U_{CE}$ corresponding to the current $I_T$ flowing through the semiconductor power device:

$$P_{DC}=U_{CE}*I_T*D$$

wherein D is a conduction duty cycle of the semiconductor power device in the calculation period $T_S$, a time interval from step 1 sensing working state parameters to step 7 performing real-time online prediction to obtain the junction temperature of each semiconductor power device;

step 4: calculating a switching loss $P_{sw}$ of the semiconductor power device according to the obtained turn-on energy $E_{on}$ and turn-off energy $E_{off}$ corresponding to the current $I_T$ flowing through the semiconductor power device:

$$P_{sw}=(E_{on}+E_{off})*f$$

wherein f is a switching frequency of the semiconductor power device;

step 5: acquiring a total loss P of the semiconductor power device according to the conduction loss and the switching loss acquired in the step 3 and the step 4:

$$P=P_{DC}+P_{sw}$$

step 6: calculating a temperature difference $\Delta T_{tjh1}$ between the junction of the semiconductor power device and the radiator surface just under the power device:

$$\Delta T_{tjh1}=\Delta T_{tjh0}+P*R_{thjc[@T_S]}-\Delta T_{tjh0}*\lambda$$

wherein $\Delta T_{tjh0}$ is the temperature difference between the junction of the power device and the radiator surface just under the power device at the end of the previous calculation period, $\lambda$ is a discrete coefficient that is obtained after optimal fitting is performed on a dynamic thermal resistance curve of the power device and that is related to the calculation period $T_S$ and the dynamic thermal resistance curve, and $R_{thjc[@T_S]}$ is a transient thermal resistance of the power device corresponding to the calculation period $T_S$;

step 7: iteratively calculating the junction temperature of the power device at each moment: repeating the step 1 to the step 6, then adding the real time temperature of the radiator surface just under the power device to the calculation result $\Delta T_{tjh1}$ of the step 6, and performing real-time online prediction to obtain the junction temperature of each semiconductor power device.

3. An on-line real time dynamic junction temperature prediction tool integrated on a semiconductor power device system, for use to predict a junction temperature for a semiconductor power device, included in the semiconductor power device system, comprising
a computer readable storage medium of the semiconductor power device system, having stored thereon a computer program, said program arranged to:
operate a processor to perform a method of
predicting a real-time dynamic junction temperature of the semiconductor power device, comprising the following steps:
step 1: sensing working state parameters of the semiconductor power device by original sampling circuits of the semiconductor power device, working state parameters of the semiconductor power device: an output current of the power device, a bus voltage of the power device, and a temperature of a radiator just under the power device;

step 2: sensing working state parameters of the semiconductor power device by original sampling circuits of the semiconductor power device, loss parameters of the semiconductor power device: a conduction voltage drop $U_{CE}$, a turn-on energy $E_{on}$, and a turn-off energy $E_{off}$ corresponding to a current $I_T$ flowing through the semiconductor power device at a given temperature;

step 3: calculating a conduction loss $P_{DC}$ of the semiconductor power device in a calculation period $T_S$ according to the obtained conduction voltage drop $U_{CE}$ corresponding to the current $I_T$ flowing through the semiconductor power device:

$$P_{DC}=U_{CE}*I_T*D$$

wherein D is a conduction duty cycle of the semiconductor power device in the calculation period $T_S$, a time interval from step 1 sensing working state parameters to step 7 performing real-time online prediction to obtain the junction temperature of each semiconductor power device;

step 4: calculating a switching loss $P_{sw}$ of the semiconductor power device according to the obtained turn-on energy $E_{on}$ and turn-off energy $E_{off}$ corresponding to the current $I_T$ flowing through the semiconductor power device:

$$P_{sw}=(E_{on}+E_{off})*f$$

wherein f is a switching frequency of the semiconductor power device;

step 5: acquiring a total loss P of the semiconductor power device according to the conduction loss and the switching loss acquired in the step 3 and the step 4:

$$P=P_{DC}+P_{sw}$$

step 6: calculating a temperature difference $\Delta T_{tjh1}$ between the junction of the semiconductor power device and the radiator surface just under the power device:

$$\Delta T_{tjh1}=\Delta T_{tjh0}+P*R_{thjc[@T_S]}-\Delta T_{tjh0}*\lambda$$

wherein $\Delta T_{tjh0}$ is the temperature difference between the junction of the power device and the radiator surface just under the power device at the end of the previous calculation period, $\lambda$ is a discrete coefficient that is obtained after optimal fitting is performed on a dynamic thermal resistance curve of the power device and that is related to the calculation period $T_S$ and the dynamic thermal resistance curve, and $R_{thjc[@T_S]}$ is a transient thermal resistance of the power device corresponding to the calculation period $T_S$;

step 7: iteratively calculating the junction temperature of the power device at each moment: repeating the step 1 to the step 6, then adding the real time temperature of the radiator surface just under the power device to the calculation result $\Delta T_{tjh1}$ of the step 6, and performing real-time online prediction to obtain the junction temperature of each semiconductor power device.

* * * * *